United States Patent
Kotani et al.

(10) Patent No.: US 7,794,897 B2
(45) Date of Patent: Sep. 14, 2010

(54) MASK PATTERN CORRECTING METHOD, MASK PATTERN INSPECTING METHOD, PHOTO MASK MANUFACTURING METHOD, AND SEMICONDUCTOR DEVICE MANUFACTURING METHOD

(75) Inventors: Toshiya Kotani, Machida (JP); Satoshi Tanaka, Kawasaki (JP); Shigeki Nojima, Yokohama (JP); Koji Hashimoto, Yokohama (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1031 days.

(21) Appl. No.: 11/068,896

(22) Filed: Mar. 2, 2005

(65) Prior Publication Data

US 2005/0250022 A1   Nov. 10, 2005

(30) Foreign Application Priority Data

Mar. 2, 2004   (JP) .............................. 2004-057490

(51) Int. Cl.
*G03F 1/00* (2006.01)

(52) U.S. Cl. .............................. 430/5; 430/311; 430/394

(58) Field of Classification Search ...................... 430/5, 430/311; 716/19, 21
See application file for complete search history.

(56) References Cited

U.S. PATENT DOCUMENTS

| | | | |
|---|---|---|---|
| 6,645,856 B2 | 11/2003 | Tanaka et al. | |
| 6,656,644 B2 | 12/2003 | Hasegawa et al. | |
| 2003/0001155 A1* | 1/2003 | Kotani et al. | 257/48 |
| 2003/0074646 A1* | 4/2003 | Kotani et al. | 716/19 |
| 2003/0229881 A1* | 12/2003 | White et al. | 716/19 |

FOREIGN PATENT DOCUMENTS

| | | |
|---|---|---|
| JP | 9-319067 | 12/1997 |
| JP | 2001-297126 | 10/2001 |
| JP | 2001-350250 | 12/2001 |
| JP | 2002-203907 | 7/2002 |
| JP | 2003-057801 | 2/2003 |
| JP | 2003-142584 | 5/2003 |
| JP | 2003142584 A * | 5/2003 |
| JP | 2004-004941 | 1/2004 |

OTHER PUBLICATIONS

Newmark et al., "Large Area Optical Proximity Correction using Pattern Based Corrections," SPIE (1994), vol. 2322, pp. 374-386.

(Continued)

*Primary Examiner*—Mark F Huff
*Assistant Examiner*—Rashid Alam
(74) *Attorney, Agent, or Firm*—Finnegan, Henderson, Farabow, Garrett & Dunner, L.L.P.

(57) ABSTRACT

A pattern correcting method for correcting a design pattern to form a desired pattern on a wafer is disclosed, which comprises defining an allowable dimensional change quantity of each of design patterns, defining a pattern correction condition for the each design pattern based on the allowable dimensional change quantity defined for the each design pattern, and correcting the each design pattern based on the pattern correction condition defined for the each design pattern.

14 Claims, 5 Drawing Sheets

OTHER PUBLICATIONS

Notification of Reasons for Rejection from the Japanese Patent Office, mailed May 7, 2008, in Japanese Patent Application No. 2005-057805, and English translation thereof.

Final Notice of Rejection from the Japanese Patent Office, mailed Jul. 29, 2008, in Japanese Patent Application No. 2005-057805, and English translation thereof.

Notification of Reasons for Rejection from the Japanese Patent Office, mailed Jan. 29, 2008, in Japanese Patent Application No. 2005-057805, and English translation thereof.

* cited by examiner

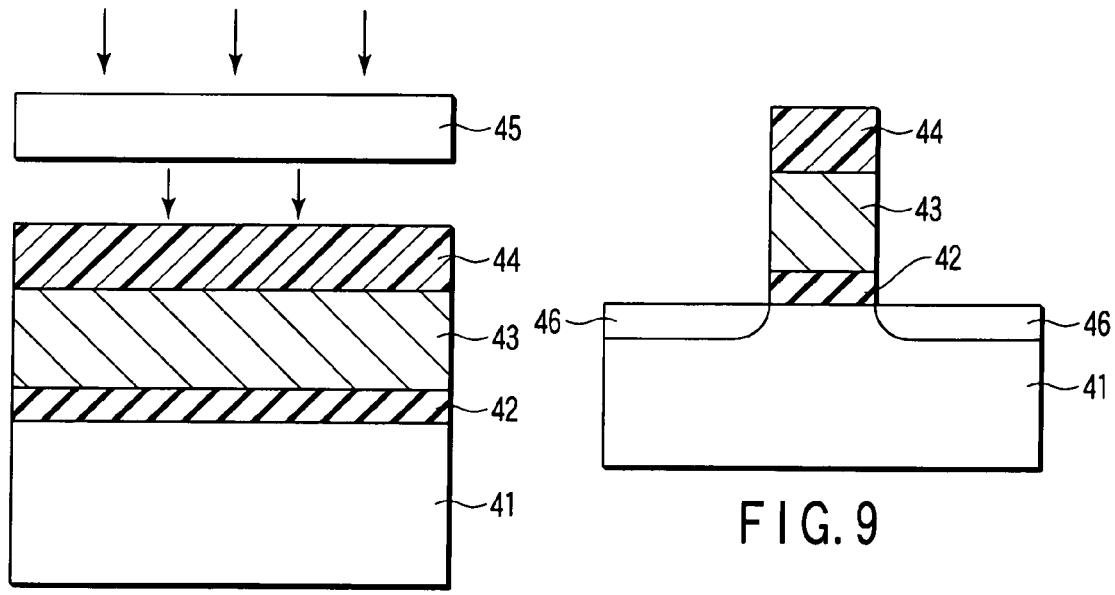
FIG. 7
FIG. 9
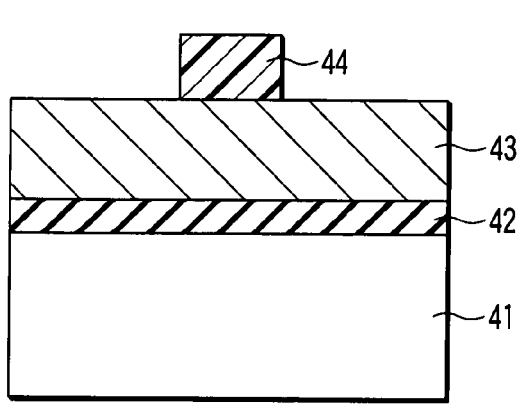
FIG. 8
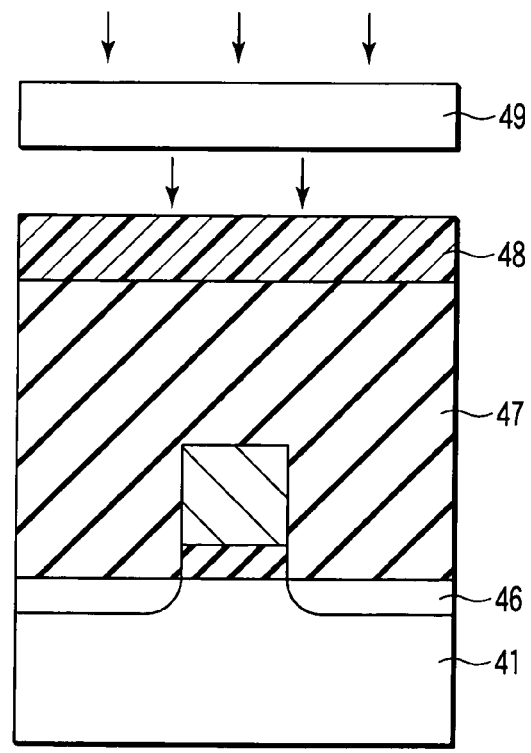
FIG. 10

MASK PATTERN CORRECTING METHOD, MASK PATTERN INSPECTING METHOD, PHOTO MASK MANUFACTURING METHOD, AND SEMICONDUCTOR DEVICE MANUFACTURING METHOD

CROSS-REFERENCE TO RELATED APPLICATIONS

This application is based upon and claims the benefit of priority from prior Japanese Patent Application No. 2004-057490, filed Mar. 2, 2004, the entire contents of which are incorporated herein by reference.

BACKGROUND OF THE INVENTION

1. Field of the Invention

The present invention relates to a mask pattern correcting method, a mask pattern inspecting method, a photo mask manufacturing method, and a semiconductor device manufacturing method.

2. Description of the Related Art

In recent years, a semiconductor manufacturing technique has been remarkably advanced. Currently, a semiconductor device of a minimum design rule of 0.13 microns is mass-produced. Such downsizing is achieved by remarkable advancement of a fine pattern forming technique such as a mask process technique, a photolithography technique, and an etching technique.

In a generation in which a pattern size is sufficiently large, a shape of a pattern to be formed on a semiconductor wafer is depicted as a design pattern as it is, a mask pattern faithful to the design pattern is generated, the mask pattern is transferred onto a resist film on the wafer by means of a projection optical system, the resist film having the mask pattern thereon is etched to form a resist pattern, and a layer under the resist pattern is etched by using the resist pattern as a mask. With these steps, a pattern substantially corresponding to design pattern can be formed on the wafer. However, with the advancement of pattern downsizing, it has been difficult to faithfully form a pattern in each process. As a result, there occurs a problem that the dimension (finished dimension) of a pattern (finished pattern) finally obtained on the wafer deviates from that of the design pattern. In other words, there occurs a problem that the dimension of the finished pattern deviates from that of the mask pattern. In particular, in a lithography process and an etching process which are the most important to achieve the size-down, the periphery of a pattern to be formed greatly affects dimensional precision of the finished pattern.

There has been reported an optical proximity correction (OPC) technique or a process proximity correction (PPC) technique, in which an assistant pattern is added to the design pattern in order to correct the deviation between the dimension of the finished pattern and that of the mask pattern so that the dimension of the to-be-pattern has a dimension of the desired pattern. These correction techniques become essential techniques in forming a pattern (Japanese Patent Application KOKAI Publication No. 9-319067, page 11 and FIG. 1; Photomask Technology and Management, SPIE Vol. 2322 p 374-336, 1994, "Large Area Optical Proximity Correction using Pattern Based Corrections", D. M. Newmark, et al.).

In order to achieve high speed circuit operation, in most recent years, downsizing of the gate dimension of a transistor has progressed at higher speed than conventional. Concurrently, an allowable change quantity of the gate dimension of the transistor becomes smaller. If the allowable dimensional change quantity decreases, the following problem occurs in pattern correction processing using the OPC or PPC.

First, it is necessary to downsize a minimum target region for pattern correction, i.e., a unit grid, and concurrently, a mask data volume increases.

In addition, in a rule based OPC, the complication of a correction rule cannot be avoided, and a processing time and an inspection time increases.

Further, in a model based OPC, it becomes important to improve predictive precision of the dimension (finished dimension) of a pattern (finished pattern) on the wafer. Thus, a larger amount of time is required for simulation applied to improve the predictive precision.

These problems also apply to downsizing of a wiring pattern as well as gate downsizing.

Conventionally, a circuit design is made by a simulation using a circuit model under a condition that the gate dimension of the transistor has a dimensional change quantity of a predetermined percentage (for example, ±10%) or a dimensional change quantity of a predetermined length (for example, ±15 nm). Therefore, in order to guarantee a circuit operation of a circuit designed by such a simulation, there is a demand for a dimensional deviation between the gate dimension of the transistor of each circuit unit of the circuit and the design pattern dimension (in other words, mask pattern dimensions) to be included within a dimensional change quantity of the above-described predetermined percentage or a dimensional change quantity of the above-described predetermined length. This dimensional change quantity of the predetermined percentage or dimensional change quantity of the predetermined length is set at an allowable dimensional change quantity of the transistor requested by the severest allowable dimensional change quantity in the transistors in all the circuit units. That is, in order to guarantee the circuit operation, correction must be performed for the transistors in all the circuit units such that the above-described dimensional deviation is included within the severest allowable dimensional change quantity. As a result, a larger amount of time is required for correction, and the correction processing efficiency has been degraded.

BRIEF SUMMARY OF THE INVENTION

According to a first aspect of the present invention, there is provided a pattern correcting method for correcting a design pattern to form a desired pattern on a wafer, the method comprising:

defining an allowable dimensional change quantity of each of design patterns;

defining a pattern correction condition for the each design pattern based on the allowable dimensional change quantity defined for the each design pattern; and correcting the each design pattern based on the pattern correction condition defined for the each design pattern.

According to a second aspect of the present invention, there is provided a photo mask manufacturing method for manufacturing a photo mask by using pattern data of a design pattern corrected by the pattern correcting method recited in the first aspect of the present invention.

According to a third aspect of the present invention, there is provided a semiconductor device manufacturing method for manufacturing a semiconductor device by using a photo mask manufactured by the photo mask manufacturing method recited in the second aspect of the present invention.

According to a fourth aspect of the present invention, there is provided a pattern inspecting method for inspecting a design pattern corrected by the pattern correcting method recited in the first aspect of the present invention, the pattern inspecting method comprising:

defining a pattern inspection condition for each of design patterns after corrected, based on an allowable dimensional change quantity defined for the each design pattern at correction, and inspecting the each design pattern based on the pattern inspection condition defined for the each corrected design pattern.

According to a fifth aspect of the present invention, there is provided a photo mask manufacturing method for manufacturing a photo mask by using pattern data of a design pattern inspected by the pattern inspecting method recited in the fourth aspect of the present invention.

According to a sixth aspect of the present invention, there is provided a semiconductor device manufacturing method for manufacturing a semiconductor device by using a photo mask manufactured by the photo mask manufacturing method recited in the fifth aspect of the present invention.

BRIEF DESCRIPTION OF THE SEVERAL VIEWS OF THE DRAWING

FIG. 7 is a cross sectional view showing a device structure in a step of a method of manufacturing a semiconductor device according to a fourth embodiment of the present invention, which is used to explain the manufacturing method;

FIG. 8 is a cross sectional view showing a device structure in a step following to the step in FIG. 7 of the method of manufacturing the semiconductor device according to the fourth embodiment of the present invention, which is used to explain the manufacturing method of the semiconductor device;

FIG. 9 is a cross sectional view showing a device structure in a step following to the step in FIG. 8 of the method of manufacturing the semiconductor device according to the fourth embodiment of the present invention, which is used to explain the manufacturing method of the semiconductor device;

FIG. 10 is a cross sectional view showing a device structure in a step following to the step in FIG. 9 of the method of manufacturing the semiconductor device according to the fourth embodiment of the present invention, which is used to explain the manufacturing method of the semiconductor device;

DETAILED DESCRIPTION OF THE INVENTION

In a semiconductor circuit, in general, it is less necessary to set a uniform allowable dimensional change quantity to circuit patterns (for example, gate patterns) of all of circuit units. Rather, the allowable dimensional change quantity is different from one another between the circuit patterns of all of circuit units.

According an embodiment of the present invention, in correction of a mask pattern, a plurality of circuit models having different allowable dimensional change quantities are prepared for a circuit pattern (for example, gate pattern). A circuit operation is simulated for each of the circuit units by using a circuit model selected for each of the circuit units from among the plurality of the prepared circuit models, which has a desired allowable dimensional change quantity. Then, a required amount of pattern correction is carried out in accordance with the result of the simulation, so that a dimensional deviation of the circuit pattern (mask pattern) in each of the circuit units is included within the desired allowable dimensional change quantity. As described above, pattern correction is carried out based on the desired allowable dimensional change quantity of each of the circuit units. Thus, the correction efficiency is improved more remarkably as compared with a conventional correcting method in which a pattern correction is carried out based on the severest allowable dimensional change quantity among the allowable dimensional change quantities of all of the circuit units.

Further, a correction condition is set based on the determined dimensional allowable change quantity for each of the individual circuit units, and correction is made in accordance with the thus set correction condition. As described, since the correction condition is set based on the determined dimensional allowable change quantity for each of the individual circuit units, and correction is made in accordance with the set correction condition, the correction efficiency is more remarkably improved.

Now, embodiments of the present invention will be described with reference to the accompanying drawings.

With reference to FIGS. 1 to 5, a description will be given with respect to a method for correcting a mask pattern.

Figure 1:
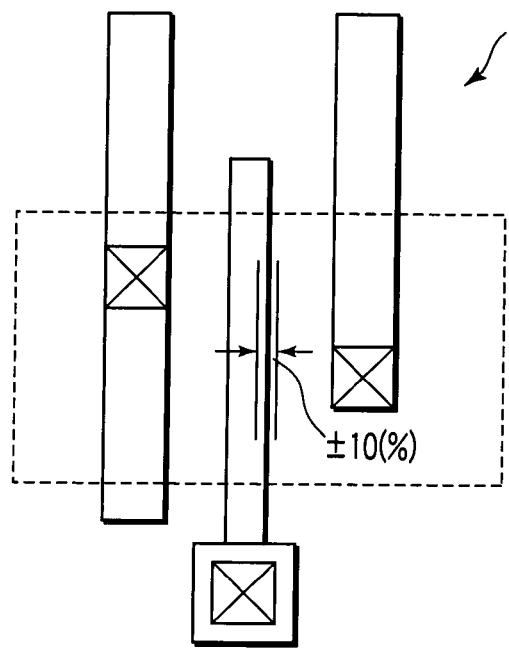
FIG. 1 is a view showing a pattern layout of a circuit unit A which includes a gate pattern (circuit pattern) of a MOS transistor.
Figure 2:
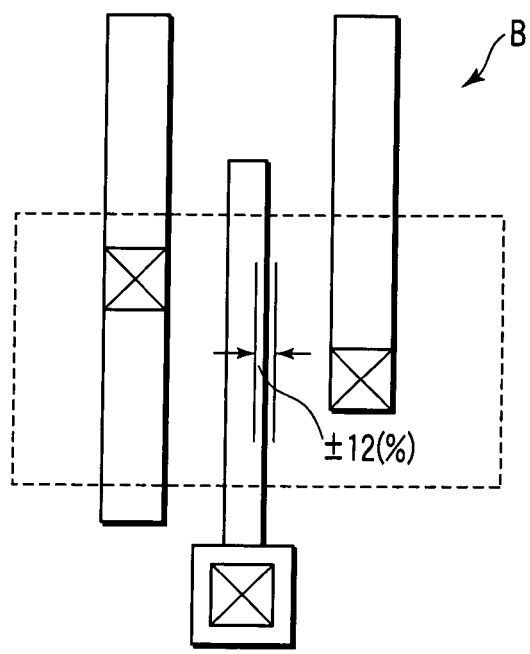
FIG. 2 is a view showing a pattern layout of a circuit unit B which includes a gate pattern (circuit pattern) of the MOS transistor.
Figure 3:
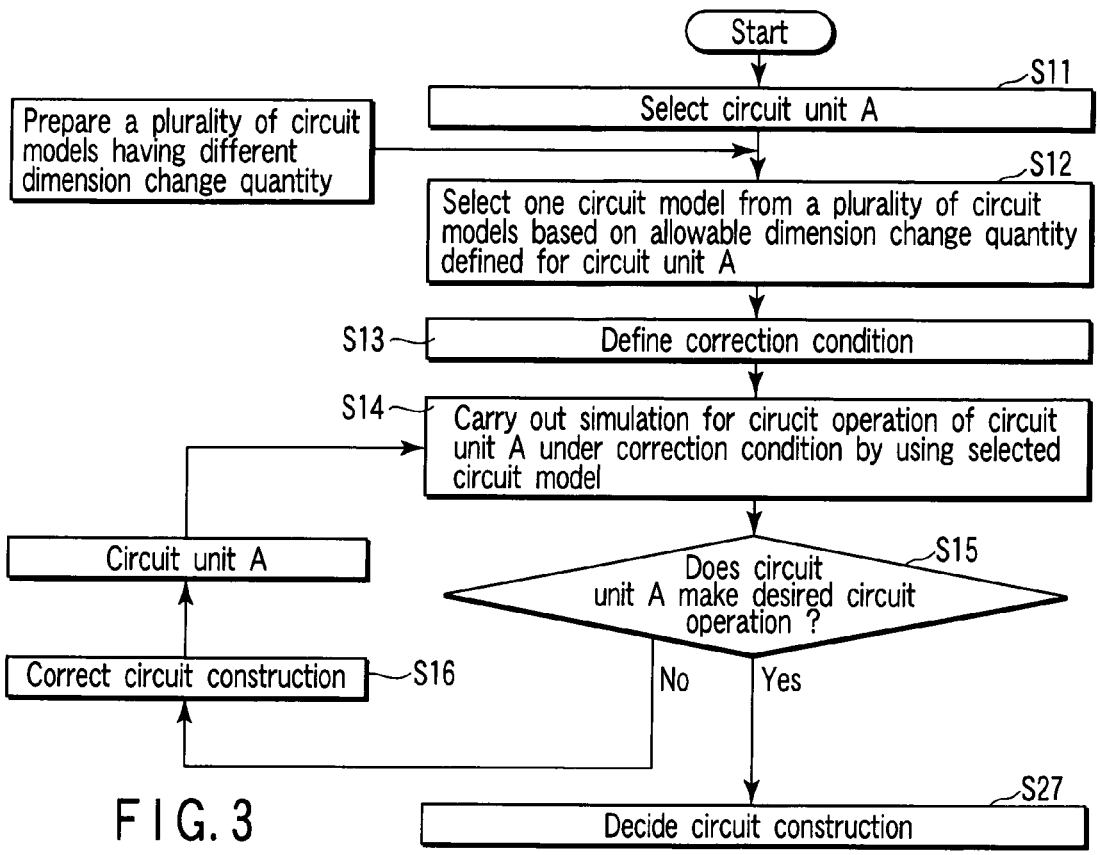
FIG. 3 is a flow chart of a correcting method according to a first embodiment of the present invention.
Figure 4:
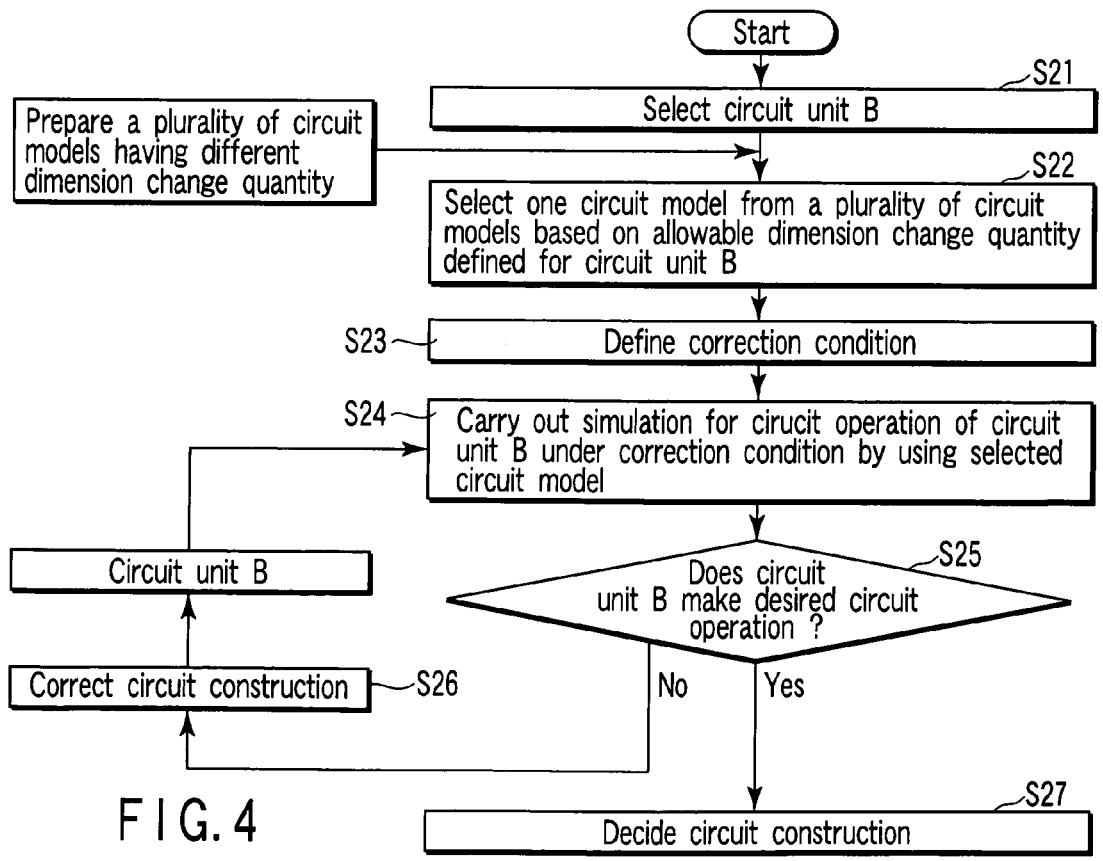
FIG. 4 is a flow chart of a correcting method according to the first embodiment of the present invention.
Figure 5:
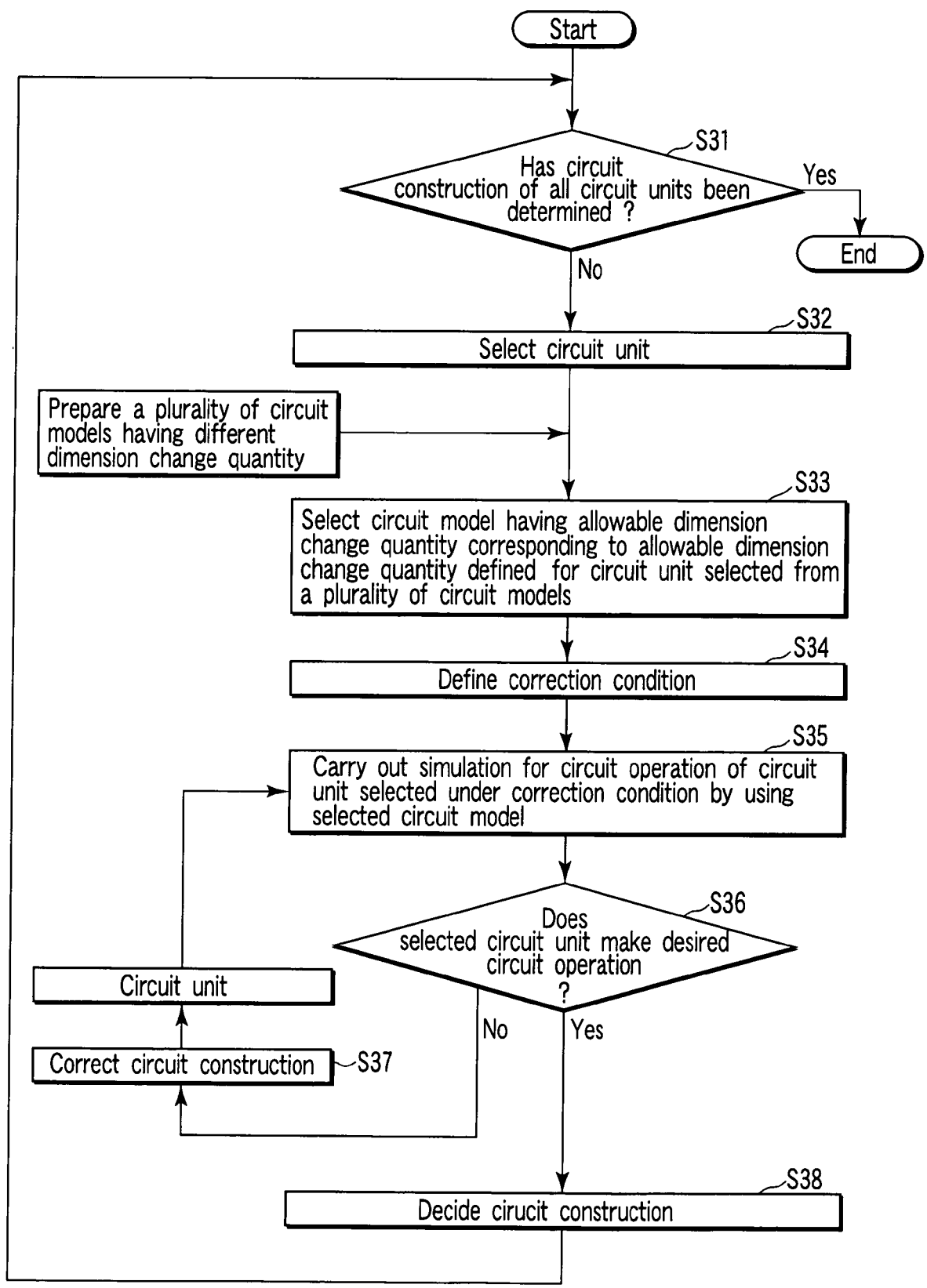
FIG. 5 is a flow chart of a correcting method according to the first embodiment of the present invention.

FIGS. 1 and 2 show pattern layouts of a circuit unit A and a circuit unit B, each of which includes a gate pattern (a circuit pattern) of an MOS transistor, respectively. FIGS. 3 to 5 are flow charts each showing correcting method.

Assume that the gate pattern of the circuit unit A shown in FIG. 1 is ±10% in its allowable dimensional change quantity and that the gate pattern of the circuit unit B shown in FIG. 2 is ±12% in its allowable dimensional change quantity.

Prior to starting a flow of correction, a plurality of circuit models having different allowable dimensional change quantities for a circuit pattern (gate pattern) are prepared.

Referring now to FIG. 3, a description will be given with respect to a case of correcting a circuit pattern (gate electrode pattern) of the circuit unit A.

First, the circuit unit A is selected (step S11).

Assuming that the allowable dimensional change quantity required for the circuit unit A is ±10%, as shown in FIG. 1, a MOS model whose allowable dimensional change quantity is set to ±10% is selected from among the plurality of MOS models (circuit models) prepared in advance (step S12).

A correction condition is defined for the circuit unit A (step S13). A corner condition (critical condition) for defining the highest speed operation and/or the lowest speed operation of the MOS model is determined for the circuit unit A. The corner condition denotes a condition determined in consideration of a gate dimensional allowable change quantity, an allowable dimensional change quantity of a device parameter, a process change quantity, and the like. Further, the best condition and/or the worst condition are/is set relevant to an external factor such as a power voltage fluctuation and a temperature change.

By using the above selected MOS model, a circuit operation of the circuit unit A is simulated (step S14) to determine whether or not a desired circuit operation is made from the viewpoint of circuit performance such as an operating speed or a timing margin (step S15). That is, it is determined whether or not a dimensional deviation of the gate pattern of the circuit unit A from the mask pattern is included within the allowable dimensional change quantity.

As a result of this simulation, in the case where it is determined that the circuit unit A does not make the desired circuit operation, correction is carried out for the circuit construction of the circuit unit A (step S16).

After the correction for the circuit construction of the circuit unit A, the circuit operation of the circuit unit A is simulated again by using the selected MOS model to determine whether or not the desired circuit operation is made.

As a result of this simulation, in the case where it is determined that the circuit unit A does not still make the desired circuit operation, the circuit construction of the circuit unit A is further corrected. That is, further correction is applied for the circuit unit A.

After the further correction for the circuit construction of the circuit unit A, the circuit operation of the circuit unit A is simulated again by using the selected MOS model to determine whether or not the desired circuit operation is made.

Correction of the circuit construction and determination of the circuit operation are repeated until the circuit unit A makes the desired circuit operation.

When it is determined that the circuit unit A makes the desired circuit operation, the circuit construction at that time is decided as a finished circuit unit (step S17). That is, the dimensional deviation of the gate pattern of the circuit unit A from the mask pattern is included within the allowable dimensional change quantity of the MOS model, i.e., within ±10% which is the desired allowable dimensional change quantity. The correction processing for the circuit unit A is then completed.

The above description applies to a case of correcting a pattern (gate electrode pattern) of the circuit unit B, as shown in FIG. 4.

Referring now to FIG. 4, a description will be given with respect to a case of correcting a circuit pattern (gate electrode pattern) of the circuit unit B.

First, the circuit unit A is selected (step S21).

Assuming that the allowable dimensional change quantity required for the circuit unit B is ±12%, as shown in FIG. 2, a MOS model whose allowable dimensional change quantity is set to ±12% is selected from among the plurality of MOS models (circuit models) prepared in advance (step S22).

A correction condition is defined for the circuit unit B (step S23). A corner condition (critical condition) for defining the highest speed operation and/or the lowest speed operation of the MOS model is determined for the circuit unit B. The corner condition denotes a condition determined in consideration of a gate dimensional allowable change quantity, an allowable dimensional change quantity of a device parameter, a process change quantity, and the like. Further, the best condition and/or the worst condition are/is set relevant to an external factor such as a power voltage fluctuation and a temperature change.

By using the above selected MOS model, a circuit operation of the circuit unit B is simulated (step S24) to determine whether or not a desired circuit operation is made from the viewpoint of circuit performance such as an operating speed or a timing margin (step S25). That is, it is determined whether or not a dimensional deviation of the gate pattern of the circuit unit B from the mask pattern is included within the allowable dimensional change quantity.

As a result of this simulation, in the case where it is determined that the circuit unit B does not make the desired circuit operation, correction is carried out for the circuit construction of the circuit unit B (step S26).

After the correction for the circuit construction of the circuit unit B, the circuit operation of the circuit unit B is simulated again by using the selected MOS model to determine whether or not the desired circuit operation is made.

As a result of this simulation, in the case where it is determined that the circuit unit B does not still make the desired circuit operation, the circuit construction of the circuit unit B is further corrected. That is, further correction is applied for the circuit unit B.

After the further correction for the circuit construction of the circuit unit B, the circuit operation of the circuit unit B is simulated again by using the selected MOS model to determine whether or not the desired circuit operation is made.

Correction of the circuit construction and determination of the circuit operation are repeated until the circuit unit B makes the desired circuit operation.

When it is determined that the circuit unit B makes the desired circuit operation, the circuit construction at that time is decided as a finished circuit unit (step S27). That is, the dimensional deviation of the gate pattern of the circuit unit B from the mask pattern is included within the allowable dimensional change quantity of the MOS model, i.e., within ±12% which is the desired allowable dimensional change quantity. The correction processing for the circuit unit B is then completed.

The foregoing descriptions have given individually the case of correcting the pattern of the circuit unit A and the case of correcting the pattern of the circuit unit B.

Actually, a plurality of circuit units are corrected in a flow comprising a series of steps. Referring now to FIG. 5, a description will be given with respect to a case of making such a correction.

Prior to start a flow of correction, a plurality of circuit models having different allowable dimensional change quantities for a circuit pattern (gate pattern) are prepared.

First, it is determined whether or not a circuit construction has been decided for all of the circuit units (step S31).

As a result of the determination, in the case where there exists a circuit unit or circuit units which have not been decided, one of the circuit units having not been decided is selected (step S32).

A MOS model having an allowable dimensional change quantity corresponding to the allowable dimensional change quantity defined for the above selected circuit unit is selected from among the plurality of MOS models (circuit models) (step S33).

A correction condition is defined for the selected circuit unit (step S34). A corner condition (critical condition) for defining the highest speed operation and/or the lowest speed operation of the MOS model is determined for the selected circuit unit. The corner condition denotes a condition determined in consideration of a gate dimensional allowable change quantity, an allowable dimensional change quantity of a device parameter, a process change quantity, and the like. Further, the best condition and/or the worst condition are/is set relevant to an external factor such as a power voltage fluctuation and a temperature change.

By using the above selected MOS model, a circuit operation of the selected circuit unit is simulated (step S35) to determine whether or not a desired circuit operation is made from the viewpoint of circuit performance such as an operating speed or a timing margin (step S36). That is, it is determined whether or not a dimensional deviation of the gate pattern of the selected circuit unit from the mask pattern is included within the allowable dimensional change quantity.

As a result of this simulation, in the case where it is determined that the selected circuit unit does not make the desired circuit operation, correction is carried out for the circuit construction of the selected circuit unit (step S37).

After the correction for the circuit construction of the selected circuit unit, the circuit operation of the selected circuit unit is simulated again by using the selected MOS model to determine whether or not the desired circuit operation is made.

As a result of this simulation, in the case where it is determined that the selected circuit unit does not still make the desired circuit operation, the circuit construction of the selected circuit unit is further corrected. That is, further correction is applied for the selected circuit unit.

After the further correction for the circuit construction of the selected circuit unit, the circuit operation of the selected circuit unit is simulated again by using the selected MOS model to determine whether or not the desired circuit operation is made.

Correction of the circuit construction and determination of the circuit operation are repeated until the selected circuit unit makes the desired circuit operation.

When it is determined that the selected circuit unit makes the desired circuit operation, the circuit construction at that time is decided as a finished circuit unit (step S38). That is, the dimensional deviation, at the decision, of the gate pattern of the selected circuit unit from the mask pattern is included within the allowable dimensional change quantity of the MOS model. Assume that the selected circuit unit is the circuit unit A requiring the allowable dimensional change quantity of ±10% and that the selected MOS model has an allowable dimensional change quantity of ±10%, then, the dimensional deviation, at the decision, of the gate pattern of the circuit unit A from the mask pattern is within ±10%, which is the allowable dimensional change quantity required for the circuit unit A. The correction processing for the selected circuit unit is then completed.

Again, it is determined whether or not a circuit construction has been decided for all of the circuit units (step S31).

As a result of the determination, in the case where there exist a circuit unit or units which have not been decided, one of the circuit units having not been decided is selected (step S32). Then, similarly, a MOS model is selected, and correction of the circuit construction and determination of the circuit operation are repeated until it is determined that the selected circuit unit makes a desired circuit operation.

When it is determined that the selected circuit unit makes the desired circuit operation, the circuit construction at that time is decided as a finished circuit unit (step S38). That is, the dimensional deviation, at the decision, of the gate pattern of the selected circuit unit from the mask pattern is included within the allowable dimensional change quantity of the MOS model. Assume that the selected circuit unit is the circuit unit B requiring the allowable dimensional change quantity of ±12% and that the selected MOS model has an allowable dimensional change quantity of ±12%, then, the dimensional deviation, at the decision, of the gate pattern of the circuit unit B from the mask pattern is within ±12%, which is the allowable dimensional change quantity required for the circuit unit B. The correction processing for the selected circuit unit is then completed.

Again, it is determined whether or not a circuit construction has been decided for all of the circuit units (step S31). As a result of the determination, in the case where there exist a circuit unit or units which have not been decided, one of the circuit units having not been decided is selected, and the steps as above described are similarly carried out. On the other hand, as the result of the determination, in the case where there does not exist a circuit unit which has not been decided yet, the correction operation ends.

According to the above correcting method, the pattern correction of the circuit units is carried out based on the desired allowable dimensional change quantity of each of the circuit units. Therefore, the further correction for each of the circuit units can be reduced to minimum, making it possible to improve the correction processing speed and reduce the correction processing time.

In the conventional correcting method, the allowable dimensional change quantity of each pattern of a pattern layout (for example, a diffusion layer pattern, a wiring pattern, and a contact hole pattern) is defined as a uniform allowable dimensional change quantity for all of the patterns. Thus, correction is repeated until all of the patterns are included within the uniform allowable dimensional change quantity regardless of the shape of the patterns and allocation environments of the patterns. As described above, conventionally, one allowable dimensional change quantity is defined for all of the patterns. Thus, further correction made for a pattern having a small allowable dimensional change quantity, i.e., a pattern requiring high correction precision, is also made for a pattern whose allowable dimensional change quantity is not so large, i.e., a pattern whose required correction precision is not so high. Thus, the correction processing efficiency is degraded.

In the present embodiment, according to the shapes of the patterns and the allocation environments of the patterns, the allowable dimensional change quantity is set for each of the patterns, and the correction parameter is set accordingly. Thus, the number of further corrections can be increased for the pattern having the small allowable dimensional change quantity, i.e., the pattern requiring high correction precision. On the other hand, the number of further corrections can be reduced to minimum for the pattern whose allowable dimensional change quantity is not so large, i.e., the pattern whose required correction precision is not so high. That is, the amount of further correction can be defined according to the allowable dimensional change quantity of each of the patterns, and thus the correction processing efficiency is improved.

The above-described pattern data correction condition include at least one conditional element of: a correction convergence condition for determining whether or not to terminate correction in accordance with a dimensional deviation between a finished pattern and a desired pattern on a wafer calculated from design pattern data after corrected, a minimum unit area of a correction region of the design pattern, a maximum move quantity allowable for the design pattern, a minimum width of the design pattern, and a minimum space width adjacent to the design pattern. The correction convergence condition means an allowable dimension of a pattern formed on a wafer. Specifically, after correction is carried out, evaluation is made to determine whether or not the dimension of the pattern formed on the wafer is included within the allowable dimension as a result of the correction. If the pattern dimension is not included within the allowable dimension, correction is again carried out and the evaluation is again made to determine whether or not the pattern dimension is included within the allowable dimension. These steps are repeated, and if the pattern dimension is finally included within the allowable dimension, the correction is completed.

Figure 6:
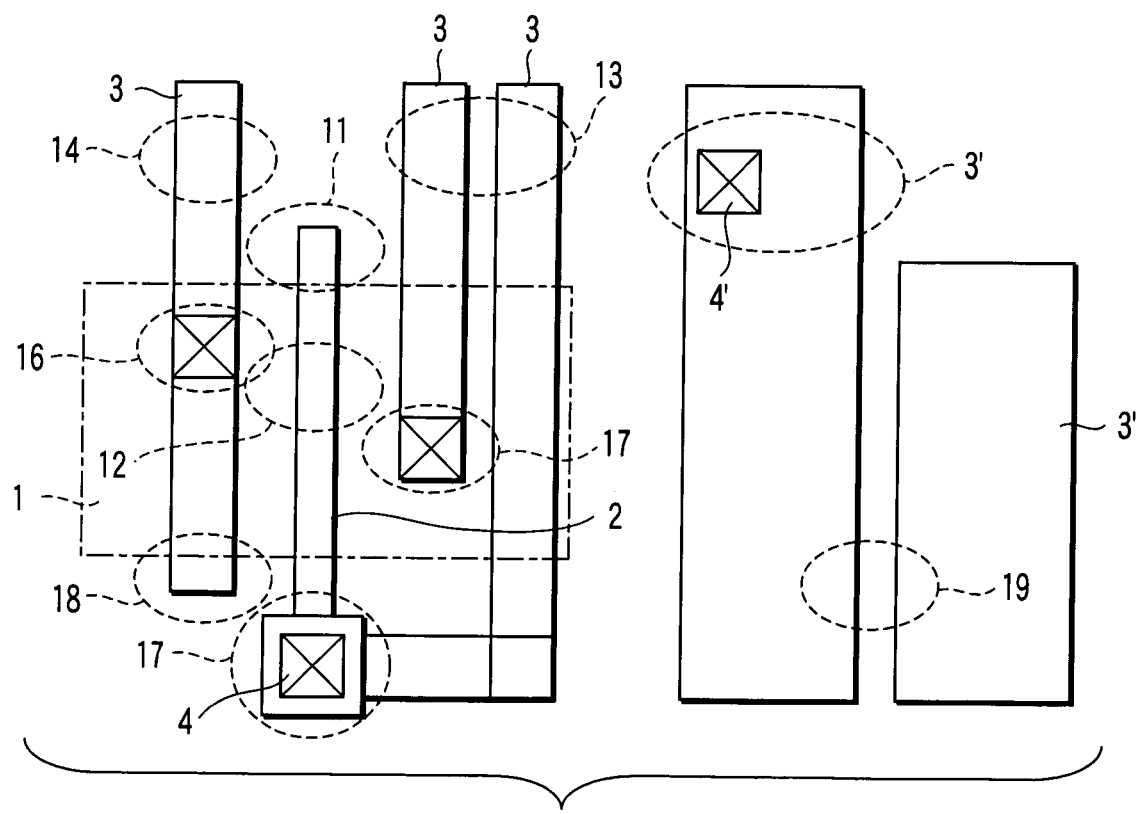
FIG. 6 is a view showing a pattern layout of a semiconductor device.

FIG. 6 is a view showing a pattern layout of one circuit unit of a semiconductor circuit. This pattern layout includes an impurity diffusion layer pattern 1, a gate pattern 2, a wiring pattern 3, and a contact hole pattern 4 for selectively connecting these patterns.

As shown in FIG. 6, in the pattern layout of the circuit unit, there exist a portion at which patterns are densely arranged or a portion at which patterns are arranged to be isolated from each other; and a portion at which patterns with their large pattern width are arranged or a portion at which patterns with their small pattern width are arranged. According to these layout features, the allowable dimensional change quantity is defined for each of the portions. By doing so, the correction quantity, i.e., the further correction can be set individually for each of the portions, and the correction processing efficiency is improved. That is, for a pattern requiring a severe correction, the number of correction calculations is increased to improve the correction precision. On the other hand, for a pattern whose correction may not be so severe, the number of correction calculations can be reduced. A description will be given below with respect to how to set the correction quantity, i.e., the further correction, in accordance with features such as a pattern width, a pattern density, a specific portion of a pattern, and the like.

In FIG. 6, a region 11 is provided as a region in which a widthwise end part of a gate layer 2 extends in the range of a process margin outwardly of an end part of an impurity diffusion layer 1. Although an increase of this extension quantity is not so problematic, if the extension quantity is reduced, and the above widthwise end part terminates inwardly of the diffusion layer 1, it is problematic. When a direction going outwardly of the end part of the diffusion layer 1 is defined as a positive direction and a direction going inwardly of the end part of the diffusion layer 1 is defined as a negative direction, a positive allowable dimensional change quantity can be highly set. Thus, further correction may be gently set. However, a negative allowable dimensional change quantity cannot be highly set, it is necessary to set the correction precision severely. In other words, in the case where the widthwise end part of the gate layer 2 extends outwardly of the end part of the impurity diffusion layer 1, further correction of the gate layer 2 may be gently set. However, in the case where the widthwise end part of the gate layer 2 terminates inwardly of the diffusion layer 1, it is necessary to severely set further correction of the gate layer 2. In addition, at a corner portion, for example, a well known correction pattern is arranged to enhance that pattern. The above regions each are enclosed in the dashed line in FIG. 6.

A region 12 is provided as a region in which the gate layer 2 is arranged on the diffusion layer 2. This region is provided as a portion which requires a small amount of allowable change quantity of gate dimensions in general. This region requires severer correction as compared with another pattern. Therefore, an allowable change quantity to the gate dimensions is calculated, and pattern correction is made in accordance with the thus calculated allowable change quantity. The allowable change quantity of the gate dimensions is small in general, and thus, further correction is severely carried out.

A region 13 is provided as a region in which narrow wiring layers 3 are densely arranged. It is important that the densely arranged wiring layers 3 are resolved as the adjacent patterns in the range of a proper process margin. Therefore, with respect to the pattern correction quantity in such a dense region, when a direction in which a width of the wiring layer increases is defined as a positive direction, it is necessary to severely set the further correction in both of the positive and negative directions.

A region 14 is provided as a region in which a narrow wiring layer 3 are arranged in isolation. In this case, the width of the wiring layer 3 may be arranged in the range of a proper process margin. That is, with respect to the pattern correction quantity, it is possible to gently set the acceleration correction in the positive direction in which the width of the wiring layer increases.

A region 15 is provided as a region in which a wide wiring layers 3' is arranged in isolation and a contact hole layer 4' is connected thereto. In this case, like the region 14, the pattern correction quantity can be gently set in the positive direction in which the width of the wiring layer increases. However, in the region 15, the contact hole layer 4' is connected to the wiring layer 3'. With respect to a wiring layer portion in the vicinity of this connecting portion, it is necessary to severely set the further correction in the negative direction in which the width of the wiring layer decreases, and make correction with high precision. If the correction precision in the negative direction is low, good connection between the wiring layer 3' and the contact hole layer 4' cannot be made, resulting in a connection failure.

A region 16 is provided as a region in which a narrow wiring layer 3 is arranged in isolation and a contact hole layer 4 is connected thereto. In this case, like the region 15, the pattern correction quantity can be gently set in the positive direction in which the width of the wiring layer increases. However, in the region 16, the contact hole layer 4 is connected to the wiring layer 3. With respect to the wiring layer portion in the vicinity of this connecting portion, like the region 15, it is necessary to severely set the further correction in the negative direction in which the width of the wiring layer 3 decreases and make correction with high precision. If the correction precision in the negative direction is low, good connection between the wiring layer 3 and the contact hole layer 4 cannot be made, resulting in a connection failure.

A region 17 is provided as a region in which a contact hole layer 4 is formed at a tip end of a narrow wiring layer 3. In this case, like the region 15 and the region 16, the pattern correction quantity can be gently set in the positive direction in which the width of the wiring layer increases. However, in the region 17, the contact hole layer 4 is connected to the wiring layer 3. With respect to the wiring layer portion in the vicinity of this connecting portion, it is necessary to severely set the further correction quantity in the negative direction in which the width of the wiring layer decreases and make correction with high precision as in the region 15 and the region 16. If the correction precision in the negative direction is low, good connection between the wiring layer 3 and the contact hole layer 4 cannot be made, resulting in a connection failure.

A region 18 is provided as a region at a tip end of a narrow wiring layer 3. Unlike the region 17, a contact hole layer 4 is not formed. In this case, degradation of the correction precision of the region 18 hardly affects anything. Thus, no problem occurs even if the correction quantity is gently set regardless of an increase or a decrease in width of the wiring layer 3.

A region 19 is provided as a region in which wide wiring layers 3 are densely arranged. In this case, it is important that a gap between these wiring layers is resolved in the range of a proper process margin. Therefore, it is sufficient if the pattern correction quantity in the positive direction in which the width of the wiring layer increases is severely set, and the pattern correction quantity in the negative direction in which the width of the wiring layer decreases is gently set.

In the meantime, it is necessary to correct a design pattern based on a deviation quantity between a finished pattern calculated from a design pattern after corrected and a desired pattern. That is, the above correction is carried out by clearly defining a correction convergence condition determined by this deviation quantity. In addition, it is also necessary to make correction so as to define a minimum region (grid) targeted for correction or a maximum move quantity permitted for a design pattern after corrected or so as to ensure the minimum line width and the minimum space width in the design pattern after corrected.

In addition, as a design technique, there can be used a conventional correcting method for defining patterns having different dimensional allowable change quantities as patterns of different layers or patterns which can be converted into their different layers and making definition to arrange only patterns having the same allowable dimensional change quantity in the same layer, thereby carrying out simulation using circuit models having a uniform allowable dimensional change quantity for each of the layers.

The above-described correction on a pattern by pattern basis can be applied to all of the design patterns to be corrected in the known OPC or PPC correction procedures, and finally, a corrected mask pattern is generated. That is, it becomes possible to properly set a correction quantity in accordance with a combination of a pattern shape including the presence or absence of a corner portion; a pattern width or the adjacent space gap; and a positional relationship to a pattern of another layer including the presence or absence of a contact hole. In this manner, a time interval required for pattern correction can be significantly reduced because excessive pattern correction is not necessary. In addition, the above-described design pattern can be easily classified by using a current design, a rule, or a checker (DRC). Namely, a processing time required for pattern correction can be significantly reduced.

Now, a description will be given with respect to a pattern inspecting method according to a second embodiment of the present invention.

A description will be given with respect to a case of inspecting whether or not the above-described deviation of the gate pattern of the circuit unit A corrected through the steps shown in FIG. 3 is in the desired allowable dimensional change quantity.

First, a inspection condition is defined based on the allowable dimensional change quantity when the circuit construction of the circuit unit A is decided in accordance with the correction process. That is, this inspection condition includes as an evaluation element a quantity of further correction when the circuit construction of the circuit unit A is decided. The above inspection condition is decided together with an acceleration quantity of this correction. By means of simulation using the decided inspection condition, it is checked whether or not the above-described deviation of the corrected gate pattern of the circuit unit A is included within the above desired allowable dimensional change quantity (step S23). As a result of the inspection, in the case where the deviation of the corrected gate pattern of the circuit unit A is not included within the desired allowable dimensional change quantity, the circuit construction is corrected. Then, this correction of the circuit construction is repeated until the deviation is included within the desired allowable dimensional change quantity.

This inspection is made for all the circuit units in the similar mode. With respect to a circuit unit which has not been included within the desired allowable dimensional change quantity, the circuit construction is corrected. This correction of the circuit construction is repeated until the deviation is included within the desired allowable dimensional change quantity.

A simulation for inspection can be executed by using a inspecting tool capable of providing simulation at a full chip level for inspecting OPC correction. By using this inspecting tool, a portion is displayed, the portion having a deviation between finished dimensions of a pattern on a wafer obtained by the simulation and those of a desired pattern. Then, it is indicated as to whether or not a process margin is sufficiently ensured at that portion. In this case, in the correction according to the embodiment described previously, an acceleration quantity of correction is set for each of the individual circuit units. Thus, in the case where any countermeasure is not taken, there is a possibility that it is determined that the process margin is sufficiently ensured at the above-described portions. However, as described above, in the inspecting method according to the present embodiment, an acceleration quantity of correction obtained when the circuit construction of the circuit unit A has been decided is taken as an evaluation element in the inspection condition. Thus, such incorrect determination does not occur. The inspection condition is defined based on the allowable dimensional change quantity when the circuit construction of the circuit unit A has been decided, thus making it possible to reduce the inspection count and reduce the inspection time.

The process margin denotes a margin to a process meter such as a deviation of an exposure quantity emitted from an exposure device, a deviation of a focus position, a non-uniform degree of illumination of the exposure device or a shape error, aberration included in a lens of the exposure device, light transmission rate of the lens; or a dimensional deviation of masks manufactured, or alternatively, process parameters such as a dimensional change quantity generated in an etching process or any other machining process.

In a third embodiment of the present invention, by using design pattern data corrected by the above-described pattern correcting method or design pattern data checked by the above-described pattern inspecting method, a photo mask having a mask pattern which corresponds to the corrected design pattern data is manufactured in accordance with a known method. By using this photo mask, a semiconductor device having a desired pattern is manufactured on a semiconductor wafer. The above photo mask has a mask pattern which corresponds to the corrected design pattern data. Thus, a film pattern formed on the semiconductor wafer also has a desired pattern.

Now, a description will be given with respect to a method of manufacturing a semiconductor device according to a fourth embodiment of the present invention, with reference to FIGS. 7-13.

In the method of manufacturing a semiconductor device according to this embodiment, a photo mask manufactured by using pattern data of a design pattern corrected by the pattern correcting method or a photo mask manufactured by using pattern data of a design pattern inspected by the pattern inspecting method, as described in the third embodiment, is used. In this embodiment, an MOS (Metal Oxide Semiconductor) transistor is referred to as an example of the semiconductor device.

As shown in FIG. 7, a gate insulating film 42 is formed on a silicon semiconductor substrate 41 by using a thermal oxidation method, a polysilicon film 43 is formed on the gate insulating film 42 by CVD (Chemicla Vapor Deposition) method. After that, the polysilicon film 43 and the gate insulating film 42 are subjected to patterning to form a gate structure comprised of the polysilicon film 43 and the gate insulating film 42. To form this gate structure, a photo resist layer 44 is formed on the polysilicon film 43, and then the photo resist layer 44 is patterning-processed by lithography to form a photo resist pattern.

At this patterning of the photo resist layer 44, use is made of a photo mask 45 manufactured by using pattern data of a design pattern corrected by the pattern correcting method or a photo mask 45 manufactured by using pattern data of a design pattern inspected by the pattern inspecting method, as described in the third embodiment. To be specific, the mask 45 is mounted above the silicon semiconductor substrate 41, and light beams are radiated onto the silicon semiconductor substrate 41 via the mask 45 from a light beam source, not shown, to transfer a pattern of the mask 45 to the photo resist layer 44.

Subsequently, the photo resist layer 44 is patterning-processed by lithography so that a photo resist pattern 44 corresponding to the pattern of the mask 45 is formed, as shown in FIG. 8.

Next, as shown in FIG. 9, the polysilicon film 43 and the gate insulating film 42 are patterning-processed to form the gate structure comprised of the polysilicon film 43 and the gate insulating film 42, by using the photo resist pattern 44 as an etching mask. Then, impurities are implanted into the silicon semiconductor substrate 41 to form source/drain regions 46, by using the photo resist pattern 44, the polysilicon film 43 (polysilicon electrode) and the gate insulating film 42, as a mask.

Subsequently, the photo resist pattern 44 is removed by a known method. Then, as shown in FIG. 10, an interlayer insulating film 47 is formed over the silicon semiconductor substrate 41 by CVD method. Following this, openings are formed in the interlayer insulating film 47 for contact to the polysilicon electrode 43 and source/drain regions 46. To form the openings, a photo resist layer 48 is formed on the interlayer insulating film 47, and then the photo resist layer 48 is patterning-processed by lithography to form a photo resist pattern.

At this patterning of the photo resist layer 48, use is made of a photo mask 49 manufactured by using pattern data of a design pattern corrected by the pattern correcting method or a photo mask 49 manufactured by using pattern data of a design pattern inspected by the pattern inspecting method, as described in the third embodiment. To be specific, the mask 49 is mounted above the silicon semiconductor substrate 41, and light beams are radiated onto the silicon semiconductor substrate 41 via the mask 49 from a light beam source, not shown, to transfer a pattern of the mask 49 to the photo resist layer 48.

Figure 11:
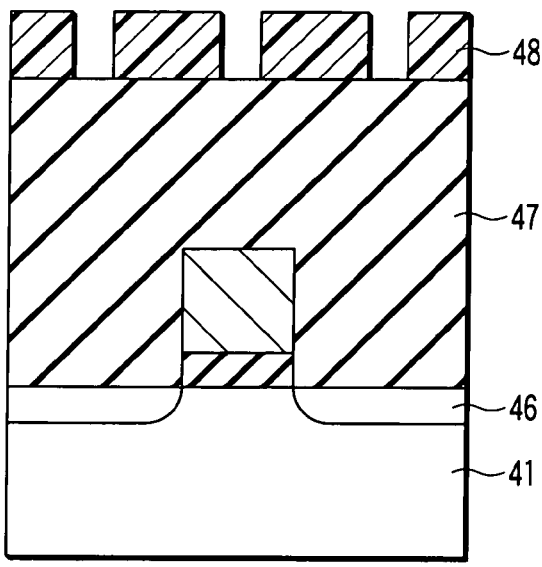
FIG. 11 is a cross sectional view showing a device structure in a step following to the step in FIG. 10 of the method of manufacturing the semiconductor device according to the fourth embodiment of the present invention, which is used to explain the manufacturing method of the semiconductor device.

Subsequently, the photo resist layer 48 is patterning-processed by lithography so that a photo resist pattern 48 corresponding to the pattern of the mask 49 is formed, as shown in FIG. 11.

Figure 12:
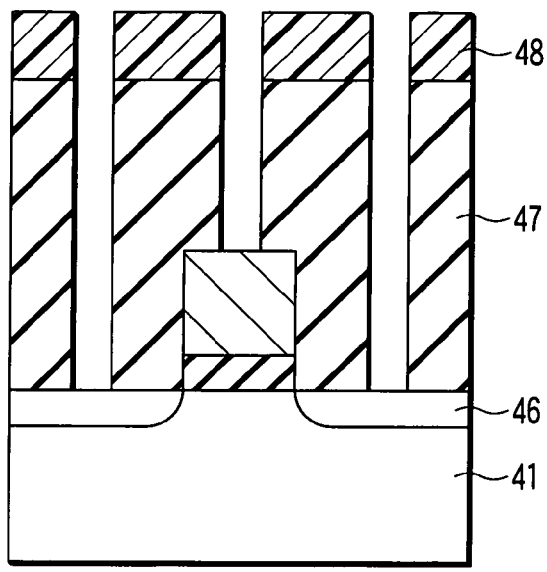
FIG. 12 is a cross sectional view showing a device structure in a step following to the step in FIG. 11 of the method of manufacturing the semiconductor device according to the fourth embodiment of the present invention, which is used to explain the manufacturing method of the semiconductor device.

Next, as shown in FIG. 12, the interlayer insulating film 47 is patterning-processed to form the openings for contact to the polysilicon electrode 43 and source/drain regions 46, by using the photo resist pattern 48 as an etching mask.

Figure 13:
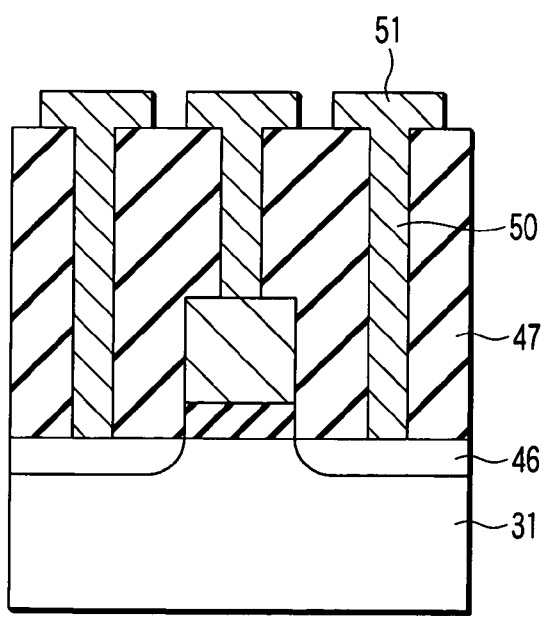
FIG. 13 is a cross sectional view showing a device structure in a step following to the step in FIG. 12 of the method of manufacturing the semiconductor device according to the fourth embodiment of the present invention, which is used to explain the manufacturing method of the semiconductor device.

Subsequently, the photo resist pattern 48 is removed by a known method. Then, as shown in FIG. 13, contact metals 50 are formed in the openings for contact to the polysilicon electrode 43 and source/drain regions 46, and wiring metals 51 contacting the contact metals 49 are formed on the interlayer insulating film 47 by a known method.

Furthermore, patterns for which a severe crossing is required are utilized as dimensional management portions at a factory or dimensional management portions at a mask house. A severe allowable dimension is required for these portions on the wafer, and thus, it is necessary to manage the mask dimension defining the pattern dimension on the wafer. Moreover, these patterns are managed in a routine scheme in the wafer dimension management at a factory. In addition, such patterns for which a severe crossing is required are utilized as experimental patterns for defining the OPC condition. Since the allowable dimensional change quantity in OPC is small, then at this portion, the experimental result (dimension obtained by experimentation on a wafer) must match the optical calculation result used in OPC. It is difficult to carry out OPC at high precision without the matching of these results. This is also utilized as experimental pattern for defining an OPC inspection condition for similar reasons.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern correcting method for correcting design patterns to form a desired pattern on a wafer, the method comprising:
    defining an allowable dimensional change quantity for each of a plurality of design patterns included in a design layout;
    selecting one of a plurality of circuit models previously prepared for the design patterns having different allowable dimensional change quantities, based on the allowable dimensional change quantity defined for each design pattern, the allowable dimensional change quantity of the selected one circuit model corresponding to the allowable dimensional change quantity of said each design pattern;
    defining a pattern correction condition for said each design pattern based on the allowable dimensional change quantity defined for said each design pattern;
    carrying out a simulation of an operation, using the selected one circuit model; and
    determining, based on the simulation, whether or not a predetermined operation margin is attained for the selected one circuit model, and performing correction for said each design pattern based on the pattern correction condition until it is determined that the predetermined operation margin is attained.

2. A pattern correcting method according to claim 1, wherein the each design pattern is a gate pattern or a wiring pattern.

3. A pattern correcting method according to claim 1, wherein the allowable dimensional change quantity is defined based on at least one of a width of said each design pattern, a width of an space adjacent to said each design pattern, and a length of an extension portion of said each design pattern from an element region.

4. A pattern correcting method according to claim 1, wherein the allowable dimensional change quantity is different between a corner portion of said each design pattern and a portion other than the corner portion.

5. A pattern correcting method according to claim 1, wherein performing correction for said each design pattern comprises carrying out the simulation of the operation using the selected one circuit model, determining whether or not the predetermined operation margin is attained as a result of the simulation, and performing further correction based on the pattern correction condition until it is determined that the predetermined operation margin is attained.

6. A pattern correcting method according to claim 1 wherein performing correction for said each design pattern is carried out so that, based on the pattern correction condition defined for said each design pattern, a dimensional deviation between said each design pattern and the desired pattern formed on a wafer is included within the allowable dimensional change quantity.

7. A photo mask manufacturing method for manufacturing a photo mask by using pattern data of a design pattern corrected by the pattern correcting method claimed in claim 1.

8. A semiconductor device manufacturing method for manufacturing a semiconductor device by using a photo mask manufactured by the photo mask manufacturing method claimed in claim 7.

9. A pattern inspecting method for inspecting a design pattern corrected by the pattern correcting method according to claim 1, the pattern inspecting method comprising:

defining a pattern inspection condition for each of design patterns after corrected, based on the allowable dimensional change quantity defined for said each design pattern, and inspecting said each design pattern based on the pattern inspection condition defined for said each corrected design pattern.

10. A pattern inspecting method according to claim 9 wherein inspecting said each design pattern comprises inspecting, based on the pattern correction condition defined for said each design pattern, whether or not a dimensional deviation between said each design pattern and the desired pattern formed on a wafer is included within the allowable dimensional change quantity.

11. A photo mask manufacturing method for manufacturing a photo mask by using pattern data of a design pattern inspected by the pattern inspecting method claimed in claim 9.

12. A semiconductor device manufacturing method for manufacturing a semiconductor device by using a photo mask manufactured by the photo mask manufacturing method claimed in claim 11.

13. A pattern correcting method according to claim 1 wherein said design patterns to which allowable dimensional change quantities are defined are design patterns of patterns to be formed on different layers on a wafer.

14. A pattern correcting method according to claim 1, wherein the pattern data correction condition include at least one conditional element of a correction convergence condition for determining whether or not to terminate correction in accordance with a dimensional deviation between a finished pattern and a desired pattern on a wafer calculated from design pattern data after corrected, a minimum unit area of a correction region of the design pattern, a maximum move quantity allowable for the design pattern, a minimum width of the design pattern, and a minimum space width adjacent to the design pattern.

* * * * *

UNITED STATES PATENT AND TRADEMARK OFFICE
CERTIFICATE OF CORRECTION

PATENT NO. : 7,794,897 B2  Page 1 of 1
APPLICATION NO. : 11/068896
DATED : September 14, 2010
INVENTOR(S) : Kotani et al.

It is certified that error appears in the above-identified patent and that said Letters Patent is hereby corrected as shown below:

Claim 3, column 15, line 7, change "an space" to --a space--.

Claim 6, column 15, line 22, change "claim 1" to --claim 1,--.

Claim 10, column 16, line 8, change "claim 9" to --claim 9,--.

Claim 13, column 16, line 23, change "claim 1" to --claim 1,--.

Claim 14, column 16, line 28, change "include" to --includes--.

Signed and Sealed this

Thirtieth Day of November, 2010

David J. Kappos
*Director of the United States Patent and Trademark Office*